(12) United States Patent
Yang et al.

(10) Patent No.: US 12,276,018 B2
(45) Date of Patent: Apr. 15, 2025

(54) MANUFACTURING APPARATUS AND METHOD FOR MICROWAVE DEVICE

(71) Applicant: Richview Electronics Co., Ltd., Hubei (CN)

(72) Inventors: Zhigang Yang, Zhuhai (CN); Zhijian Wang, Zhuhai (CN); Jiulin Guo, Zhuhai (CN)

(73) Assignee: Richview Electronics Co., Ltd., Hubei (CN)

( * ) Notice: Subject to any disclaimer, the term of this patent is extended or adjusted under 35 U.S.C. 154(b) by 43 days.

(21) Appl. No.: 17/922,169

(22) PCT Filed: Apr. 20, 2021

(86) PCT No.: PCT/CN2021/088271
§ 371 (c)(1),
(2) Date: Nov. 11, 2022

(87) PCT Pub. No.: WO2021/223589
PCT Pub. Date: Nov. 11, 2021

(65) Prior Publication Data
US 2023/0167541 A1 Jun. 1, 2023

(30) Foreign Application Priority Data
May 8, 2020 (CN) .......................... 202010381497.1

(51) Int. Cl.
*H01J 37/32* (2006.01)
*C23C 14/02* (2006.01)
(Continued)

(52) U.S. Cl.
CPC ............ *C23C 14/185* (2013.01); *C23C 14/02* (2013.01); *C23C 14/35* (2013.01); *C23C 14/54* (2013.01); *H01J 37/32715* (2013.01)

(58) Field of Classification Search
CPC ....... C23C 14/185; C23C 14/02; C23C 14/35; C23C 14/54; C23C 14/352; C23C 14/505; (Continued)

(56) References Cited

U.S. PATENT DOCUMENTS

| 3,746,571 A | 7/1973 | Little, Jr. |
| 5,759,282 A | 6/1998 | Yang |

(Continued)

FOREIGN PATENT DOCUMENTS

| CN | 1500284 | 5/2004 |
| CN | 102312203 | 1/2012 |

(Continued)

OTHER PUBLICATIONS

Candace Flores, "Radiofrequency and Microwave Radiation", Mar. 1, 2018, (Year: 2018).*

(Continued)

*Primary Examiner* — Rodney G McDonald
(74) *Attorney, Agent, or Firm* — Warner Norcross + Judd LLP

(57) ABSTRACT

The present invention relates to a manufacturing apparatus and a manufacturing method for microwave means. The manufacturing apparatus (1) for microwave means comprises: a fixture (10, 10'), the fixture (10, 10') comprising a base (11) capable of rotating about a first axis (A1), and a carrier (12) capable of swinging about a second axis (A2), the carrier (12) being connected to the base (11) so as to hold an insulating substrate (40), wherein the first axis (A1) intersects the second axis (A2); a source (20) for releasing metal ions towards the insulating substrate (40); and a controller (30), the controller (30) coupled to the fixture (10, 10') and the source (20) and configured to control a movement pattern of the fixture (10, 10') and/or an angle of the source (20) such that the insulating substrate (40) receives the metal ions from a plurality of angles and a metal layer (50) is formed over all surfaces (41) of the insulating substrate (40).

23 Claims, 4 Drawing Sheets

(51) Int. Cl.
*C23C 14/18* (2006.01)
*C23C 14/35* (2006.01)
*C23C 14/54* (2006.01)

(58) Field of Classification Search
CPC ....... C23C 14/20; C23C 14/205; C23C 14/22; C23C 14/48; H01P 11/00; H01J 37/32715; H01J 37/32733; H01J 37/32752; H01J 37/32761; H01J 37/3277; H01J 37/32779
USPC .................................... 204/298.26, 298.27
See application file for complete search history.

(56) References Cited

U.S. PATENT DOCUMENTS

| | | | | |
|---|---|---|---|---|
| 5,962,080 | A * | 10/1999 | Tan | C23C 14/46 427/595 |
| 6,800,183 | B2 * | 10/2004 | Takahashi | H01J 37/3435 204/298.26 |
| 8,535,495 | B2 * | 9/2013 | Wu | C23C 14/505 118/728 |
| 2004/0065262 | A1 | 4/2004 | Burns et al. | |
| 2006/0125579 | A1 * | 6/2006 | Baleras | H01P 11/007 333/210 |
| 2009/0098306 | A1 * | 4/2009 | Druz | H01J 37/32752 427/523 |
| 2009/0258151 | A1 | 10/2009 | Mitchell et al. | |
| 2012/0103794 | A1 * | 5/2012 | Jung | C23C 14/50 204/192.15 |
| 2015/0307986 | A1 | 10/2015 | Hegde et al. | |

FOREIGN PATENT DOCUMENTS

| | | |
|---|---|---|
| CN | 107022747 | 8/2017 |
| CN | 109652780 | 4/2019 |
| EP | 0 863 226 | 9/1998 |

OTHER PUBLICATIONS

Search Report translation in English for International Application No. PCT/CN2021/088271 mailed Jun. 18, 2021.

* cited by examiner

MANUFACTURING APPARATUS AND METHOD FOR MICROWAVE DEVICE

TECHNICAL FIELD

The present invention relates to manufacturing apparatuses and manufacturing methods for microwave means, and in particular to apparatuses and methods for metallizing a surface of the insulating substrate of microwave means.

BACKGROUND

Microwave means refers to devices operating in a microwave band (having a frequency of 300-300000 MHz), including microwave oscillators, power amplifiers, frequency mixers, wave detectors, wave filters, antenna oscillators, cell phone antennas and the like, which are widely used in aerospace, radar, electronic countermeasures, broadcasting and communication systems and other electronic equipment. Taking filter as an example, it is a frequency selection device, capable of passing only useful signals and effectively suppressing useless signals so as to solve interference between different frequency bands and different forms of communication systems. The higher the order of filters are, the more functional electronic components per unit area there would be, the better the performance is, and correspondingly the greater the manufacturing difficulties are. How to make filters of a same order smaller in size or make filters of a same size higher in order so as to improve the filter performance has become a topical issue for industry research.

The cavity filter adopts a resonant cavity structure, wherein one cavity can be equivalent to an inductor in parallel connection to a capacitor to form one resonant stage, thus achieving the filtering function. Compared with other filters, the cavity filter has a solid structure, small size, stable and reliable performance, proper Q value, good heat dissipation, and ease of implementing a high-order filter, such that it is widely applied in base stations for communications. As shown in FIG. 1, a typical cavity filter 60 includes a bottom surface 61 and a side surface 62; a number of solid or hollow resonant columns 63 are provided at the bottom, the interior of the cavity is divided into several resonant cavities by separation walls 64, and slot openings 65 are provided in the separation walls 64 to realize communication between the resonant cavities.

The cavity filter has two major requirements as follows: good rigidity and high temperature resistance of the material; low roughness and high bonding of the surface metal layer. The insulating substrate of a cavity filter typically includes PEI, PI, PPS, LCP, ABS or other polymer materials, which have a high glass transition temperature $T_g$ and a low coefficient of thermal expansion CTE. Plastic cavity filters based on these materials have the advantages of portability, good uniformity, low $D_k$ and $D_f$, easy processing, high commissioning efficiency, and suitability for integrated design, thus offering good prospects for application. To further reduce the CTE and improve thermal conductivity, polymer materials may also be used together with inorganic fillers such as glass fibers, ceramics, and minerals. In addition, the roughness of the surface metal layer determines the performance of reflection, oscillation and insertion loss of signals, while the bonding affects the peeling of the metal layer and, in turn, the stability of the filter performance. Currently, the following processes are mainly used to metallize the surface of cavity filters: roughing with a roughening solution and/or sandblasting, followed by chemical plating of Pd and Cu, or chemical plating of Pd and Ni, followed by electroplating of Cu (≥5 µm) and Ag (≥1 µm). Here, the chemical treatment for ensuring the bonding strength causes greater roughness (Ra is up to 1.6 µm) and the sandblasting incurs even greater roughness, thus leading to greater insertion loss for critical electrical properties.

Moreover, one of the difficulties in manufacturing a high-order filter or cavity filter consists in the surface metallization process. For substrates of miscellaneous 3D devices having a small size and a close arrangement, a uniform metallization of their surfaces without dead spaces (dead corners) is crucial for filter manufacturing. The prior art processes are very weak in the metallization of corners or deep holes of various minor 3D structures, and are unable to solve the problems of metal surface cracks, sharp bumps, voids, and poor metal-substrate bonding at dead spaces, all of which will lead to a significant degradation of the filter performance. For example, all surfaces within the cavity filter need to be metallized. As the number of channels increases, for example from 1 channel to 4 or 8 channels, the number of resonant columns and separation walls within the cavity will increase significantly, and the depth of the cavity may reach 15 mm or more. In this case, if the surface of the insulating substrate is not at a certain angle relative to the source during vacuum treatment, the metal plating will be very thin or even lead to a dead space, i.e. area without metal plating, in the bottom areas of the resonant columns, the bottom areas of the separation walls, the inner bottom areas of the cavity walls and the like.

SUMMARY OF THE INVENTION

In view of the above-mentioned problems, the present invention intends to provide a manufacturing apparatus and manufacturing method for microwave means, capable of avoiding the above-identified deficiencies in the existing processes, achieving a full metal coverage over the surface of the microwave means without dead spaces, and obtaining a metal layer with a high bonding strength and a low surface roughness on the surface of the microwave means.

According to one aspect, the present invention provides a manufacturing apparatus for microwave means, comprising: a fixture, the fixture comprising a base capable of rotating about a first axis, and a carrier capable of swinging about a second axis, the carrier being connected to the base so as to hold an insulating substrate, wherein the first axis intersects the second axis; a source for releasing metal ions towards the insulating substrate; and a controller, the controller coupled to the fixture and the source, and configured to control a movement pattern of the fixture and/or an angle of the source such that the insulating substrate receives the metal ions from a plurality of angles and a metal layer is formed over all surfaces of the insulating substrate.

According to another aspect, the present invention provides a manufacturing method for microwave means, comprising: holding an insulating substrate on a carrier of a fixture, the fixture comprising a base capable of rotating about a first axis and the carrier connected to the base and capable of swinging about a second axis, wherein the first axis intersects the second axis; switching on a source to release metal ions towards the insulating substrate; and controlling a movement pattern of the fixture and/or an angle of the source such that the insulating substrate receives the metal ions from a plurality of angles and a metal layer is formed over all surfaces of the insulating substrate.

By controlling the movement pattern of the fixture and/or the angle of the source in the manufacturing apparatus such that the insulating substrate of the microwave means can receive metal ions from multiple angles and a metal layers is formed on all surfaces, the present invention can achieve full metal coverage on the surface of the microwave means and avoid the emergence of dead spaces. In addition, by means of the ion injection and plasma deposition techniques, the present invention can obtain a metal layer with a high bonding strength and a low surface roughness over the surface of microwave means, thus endowing the microwave means with better electrical properties and greater stability.

BRIEF DESCRIPTION OF THE DRAWINGS

These and other features, aspects and advantages of the present invention will be more readily understood by those skilled in the art after reading the following detailed description with reference to the accompanying drawings. For clarity, the accompanying drawings are not necessarily drawn to scale, but rather some portions are exaggerated to show details. In all of the accompanying drawings, like elements are referred to by like reference numerals.

FIG. 7 illustrates the structure of an antenna oscillator, wherein FIG. 7(a) shows a front view of the antenna oscillator, FIG. 7(b) shows a top view, FIG. 7(c) shows a rear view, and FIG. 7(d) a sectional view along the line A-A shown in FIG. 7(a).

FIG. 8 schematically shows changes in the section view of an insulating substrate of a microwave means in a manufacturing method for microwave means according to a fourth embodiment, wherein FIG. 8(a) illustrates an insulating substrate, FIG. 8(b) illustrates a first deposition layer, FIG. 8(c) illustrates a second deposition layer, and FIG. 8(d) illustrates a thickening layer.

FIG. 9 schematically shows changes in the section view of an insulating substrate of a microwave means in a manufacturing method for microwave means according to a fifth embodiment, wherein FIG. 9(a) illustrates the insulating substrate, FIG. 9(b) illustrates a doping layer, FIG. 9(c) illustrates a plasma deposition layer, FIG. 9(d) illustrates a sputter deposition layer, and FIG. 9(e) shows a thickening layer.

Figure 1:
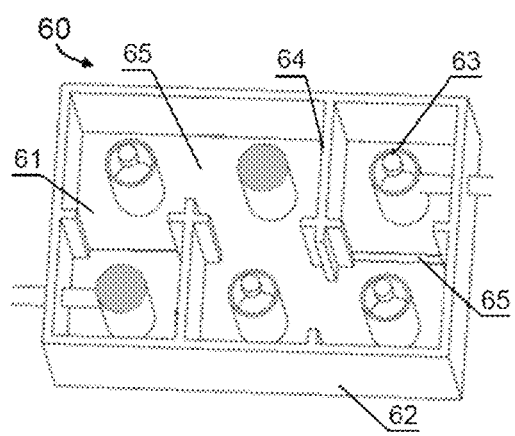
FIG. 1 illustrates the structure of a cavity filter.

REFERENCE SIGNS 1 manufacturing apparatus
10 fixture
11 base
12 carrier
A1 first axis
A2 second axis
A3 third axis
13 first carrier
A4 fourth axis
14 second carrier
A5 fifth axis
15 gear
16 roller
20 source
21 vertical source
22. tilted source
D1 first direction
D2 second direction
θ angle
30 controller
4 microwave means
40 insulating substrate
41 surface of insulating substrate
50 metal layer
51 plasma deposition layer
511 first deposition layer
512 second deposition layer
52 doping layer
53 sputter deposition layer
54 thickening layer
60 cavity filter
61 bottom surface
62 side surface
63 resonant column
64 separation wall
65 slot opening
70 antenna oscillator
71 feeder network
72 Radiation unit.

DETAILED DESCRIPTION

In the following, embodiments of the present invention will be described in detail with reference to the accompanying drawings. It will be understood by those skilled in the art that the contents herein describe only exemplary embodiments of the present invention and are in no way intended to limit the scope of protection thereof. For example, elements or features described in one of the accompanying drawings or embodiments of the present invention may be combined with other elements or features described in other accompanying drawings or embodiments.

Figure 8:
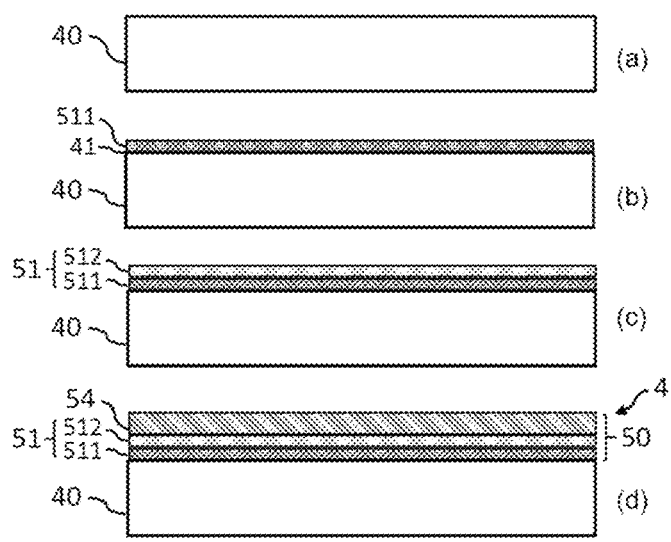
Figure 9:
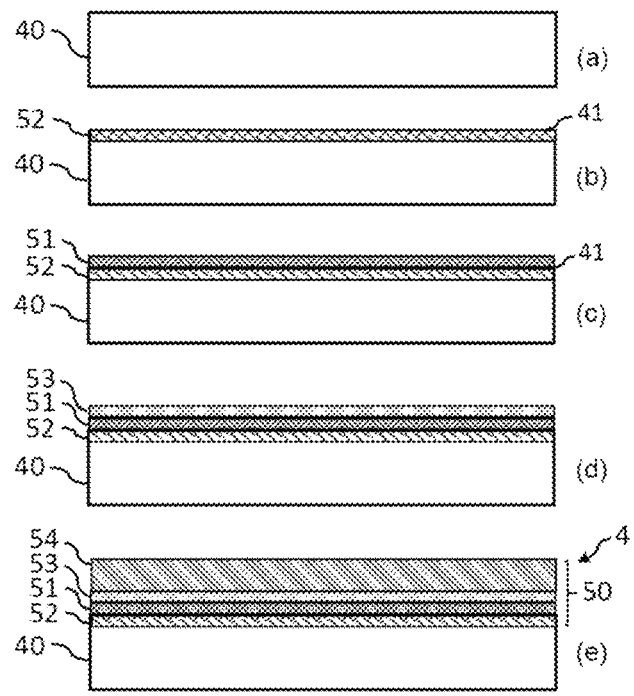

Among the accompanying drawings, FIGS. 2 to 6 relate to a manufacturing apparatus for microwave means, showing schematically the structure of the manufacturing apparatus for microwave means according to the first, second and third embodiments, respectively. FIGS. 8 and 9 relate to a manufacturing method for microwave means, schematically showing changes in the section view of an insulating substrate of a microwave means in a manufacturing method for microwave means according to the fourth and fifth embodiments, respectively. Hereinafter, the manufacturing apparatus and the manufacturing method for microwave means will be described in detail with reference to these drawings.

FIRST EMBODIMENT

Figure 2:
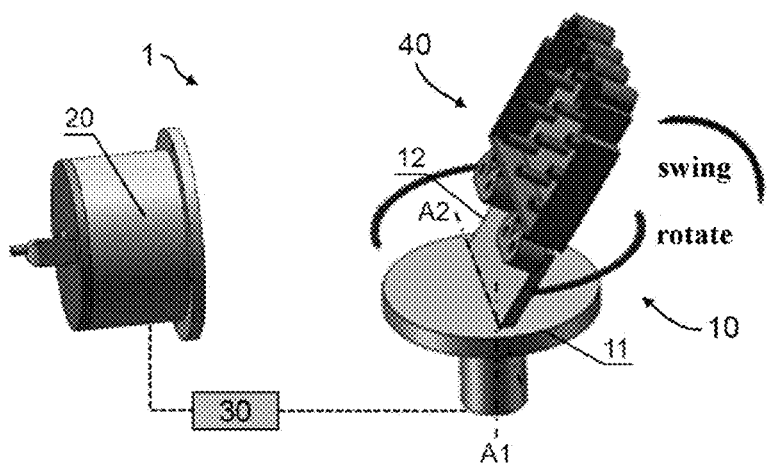
FIG. 2 schematically shows the structure of a manufacturing apparatus for microwave means according to a first embodiment.

FIG. 2 schematically shows the structure of a manufacturing apparatus for microwave means according to a first embodiment. As shown in the drawing, the manufacturing apparatus 1 for microwave means includes a fixture 10, a source 20, and a controller 30. The fixture 10 includes a base 11 capable of rotating about a first axis A1, and a carrier 12 capable of swinging about a second axis A2. The carrier 12 is connected to the base 11 so as to hold an insulating substrate 40 for microwave means. The first axis A1 intersects the second axis A2. The source 20 is used to release a selected type of metal ions towards the insulating substrate 40. The controller 30 is coupled to the fixture 10 and the source 20 and is configured to control a movement pattern of the fixture 10 and/or an angle of the source 20 such that the insulating substrate 40 can receive metal ions from a plurality of angles and a metal layer is formed over all surfaces of the insulating substrate 40.

In the illustrated embodiment, the base 11 includes a cylindrical shaft and a disc located on top of the shaft. The shaft may be formed integrally with the disc, or they may be formed separately and then assembled together. The first axis A1 is oriented substantially vertically and constitutes a rotational axis of the shaft. The base 11 is capable of rotating about the first axis A1 in a clockwise or counterclockwise direction in a range of ±0-360° when viewed from above. The carrier 12 is pivotally connected to the upper surface of the disc, for example by hinges, and is capable of swinging about the second axis A2 in a range of 0-180° relative to the upper surface of the disc. The second axis A2 is located on the upper surface of the base and is preferably perpendicular to the first axis A1. The carrier 12 is shaped as a flat plate, and holds the insulating substrate 40 for the microwave means fixedly on its support surface towards the source 20, such that the cavity of the insulating substrate 40 is open towards the source 20. Thus, metal ions released from the source 20 can be incident on the insulating substrate 40 in a linear direction, thereby forming a metal layer on the surface of the insulating substrate 40. The insulating substrate 40 may be secured to the carrier 12 through fastening components such as screws, or secured to the carrier 12 via interference fit, snap fit, etc.

The source 20 is positioned opposite to the insulating substrate 40 and is illustrated in the drawing as having only one vertical source. However, a plurality of sources 20 may be provided, and the source may be replaceable. Thus, when one source 20 fails or other types of metal ions are needed, the source 20 may be replaced with a new source or other type of source. The source 20 may include a plasma deposition source, metal ions released therefrom being deposited onto the surface of the insulating substrate 40 to form a plasma deposition layer. The source 20 may also include an ion injection source, metal ions released therefrom being incident below the surface of the insulating substrate 40 to form a doping layer. Moreover, the source 20 may additionally include a magnetically controlled sputter deposition source, metal ions released therefrom being deposited onto the surface of the insulating substrate to form a sputter deposition layer. Both the plasma deposition layer and the sputter deposition layer are parts of the metal layer according to the present invention. These sources may be used independently or in combination.

The fixture 10 and the source 20 each include a drive mechanism which is not shown. The controller 30 is coupled to the respective drive mechanisms of the fixture 10 and the source 20 and is configured to send drive signals to these drive mechanisms to control the movement of the fixture 10 and the source 20, respectively. For example, the controller 30 may control the angle of orientation of the source 20, and the relative motion of individual components in the fixture 10. The controller 30 may also control various operating parameters of the source 20, such as voltage, current, maintaining temperature, operating time, etc. Furthermore, the manufacturing apparatus 1 for microwave means may also include various types of sensors for detecting the angle of orientation of the source 20, the speed and rotating or swinging angle of the base 11 and the carrier 12, the position of the insulating substrate 40, or the presence or absence of a metal layer on the surface of the insulating substrate 40, etc. The controller 30 receives various signals from these sensors and provides feedback control of the fixture 10 and the source 20 based on these signals so that a metal layer is formed on all surfaces of the insulating substrate 40.

During operations of the manufacturing apparatus 1, the insulating substrate 40 is first held on the carrier 12 of the fixture 10, and the fixture 10 is moved to a suitable station within the manufacturing apparatus. At this point, the insulating substrate 40 is opposed to the metal ion release port of the source 20 and separated at an appropriate distance therefrom. Then, the source 20 is switched on to release metal ions towards the insulating substrate 40, and the metal ions are incident on the insulating substrate 40, thereby forming a metal layer on the surface of the insulating substrate 40. In this process, the source 20 is kept stationary, but the base 11 of the fixture 10 is made to rotate about the first axis A1 while the carrier 12 of the fixture 10 is made to swing about the second axis A2. Of course, it is also possible to stop the base 11 of the fixture 10 after rotating around the first axis A1 to a particular position, and then cause the carrier 12 of the fixture 10 to swing around the second axis A2.

Through the rotation of the base 11 around the first axis A1 and the swing of the carrier 12 around the second axis A2, the insulating substrate 40 is able to receive metal ions released from the source 20 from a number of different angles, enabling metal ions to be incident on various parts of the surface of the insulating substrate 40, such as bottom areas of resonant columns 63, bottom areas of separation walls 64, bottom areas of the inner cavity walls, etc. As a result, dead space can be avoided at the corners of the insulating substrate 40, and full metal coverage on the surface of the microwave means can be achieved. The timing and angular range of rotation and swing can be adjusted as needed. For example, in the case where it is desired to make the metal layer at the bottom areas of the separation walls 64 thicker, the base 11 and the carrier 12 of the fixture 10 may be adjusted so that metal ions released from the source 20 directly face the areas and are then deposited for a longer period of time.

Figure 3:
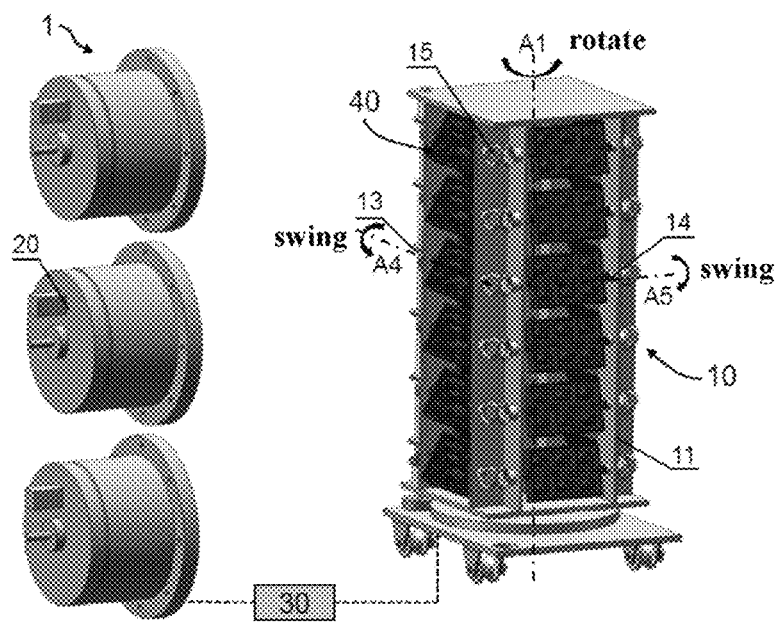
FIG. 3 schematically shows the structure of a manufacturing apparatus for microwave means according to an alternative of the first embodiment.

FIG. 3 schematically shows the structure of a manufacturing apparatus according to an alternative of the first embodiment described above. In this alternative, the source 20 includes three vertical sources 21 arranged in a vertical direction to cover the entire height of the insulating substrates 40 held in the fixture 10. The fixture 10 includes a base 11 capable of rotating about a first axis A1, and a plurality of carriers 12 arranged along the first axis A1, where the first axis A1 is substantially parallel to the vertical direction. The base 11 is shown as a substantially rectangular holder rotatably connected to the base plate, provided with four columns and a plurality of rotatable rods arranged along the first axis A1 between two adjacent columns These rods constitute the carriers 12 in this alternative, capable of fixedly holding the insulating substrates 40. A first carrier 13 provided on a first side of the base 11 is capable of swinging about a fourth axis A4, and a second carrier 14 provided on a second side of the base 11 is capable of swinging about a fifth axis A5, wherein the fourth axis A4 intersects the fifth axis A5 and both are perpendicular to the first axis A1 of the base 11. Although it's not shown in the drawing, a third carrier and a fourth carrier similar to the first carrier 13 and the second carrier 14 may also be provided on the other two sides of the base 11. A gear 15 is provided at two ends of each rotatable rod, and gears 15 that are provided at a same height on adjacent sides mesh with each other. In this way, when the base 11 of the fixture 10 rotates about the first axis A1, the first to fourth carriers provided on the four sides of the base 11 are able to receive metal ions released from the three sources 20, and when the carriers on one side swing in a direction, the carriers on the adjacent sides are able to swing in the opposite direction under the meshing of the gears 15.

SECOND EMBODIMENT

Figure 4:
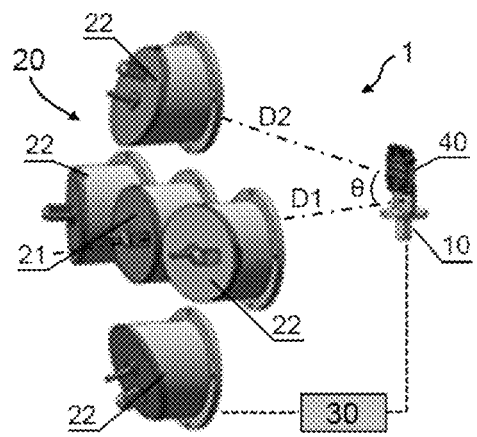
FIG. 4 schematically shows the structure of a manufacturing apparatus for microwave means according to a second embodiment.

FIG. 4 schematically shows the structure of a manufacturing apparatus for microwave means according to a second embodiment. This manufacturing apparatus has a same configuration as that of the first embodiment, differing only in the composition of the source 20 per se.

In this embodiment, the source 20 includes a vertical source 21 and a plurality of tilted sources 22 disposed around the vertical source 21. Four tilted sources 22 are shown, disposed on the top, bottom, left and right sides of the vertical source 21, respectively. However, both the number and location of the tilted sources 22 can be adjusted/changed, for example, by having six or eight tilted sources 22 evenly spaced along the circumferential direction of the vertical source 21. The vertical source 21 releases metal ions in a first direction D1, which is substantially perpendicular to the bottom surface of the insulating substrate 40. That is, the metal ions released from the vertical source 21 can be incident on the bottom surface of the insulating substrate 40 along a straight line. The tilted sources 22 release metal ions in a second direction D2, which forms an angle θ with the first direction D1. The angle θ is greater than 0° and less than 90°, for example, in the range of 15°-60°, preferably 45°. The metal ions released from the tilted sources 22 can be incident along a straight line onto areas such as the side surfaces of the insulating substrate 40, and the side surfaces of the resonant columns 63 and the separation walls 64.

During operations of the manufacturing apparatus 1, the insulating substrate 40 is held on the carrier 12 of the fixture 10 and the fixture 10 is moved to a suitable station within the manufacturing apparatus, such that the bottom surface of the insulating substrate 40 is positioned perpendicularly and opposite to the release port of the source 20. The fixture 10 is held stationary, i.e., the base 11 of the fixture 10 does not rotate and the carrier 12 does not swing up and down. Then, the vertical source 21 and the tilted sources 22 are switched on, and the surfaces of the insulating substrate 40 are coated simultaneously from all directions, such as up, down, left and right, using multiple sources orientated at different angles, so that dead space can be avoided and the full metallization cover of the surfaces can be achieved. It is possible to switch on all of the sources at the same time, or only some of the sources, or to switch on some of the sources first and then others of the sources, as long as metal ions released from these sources can cover all the surfaces of the insulating substrate 40.

THIRD EMBODIMENT

Figure 5:
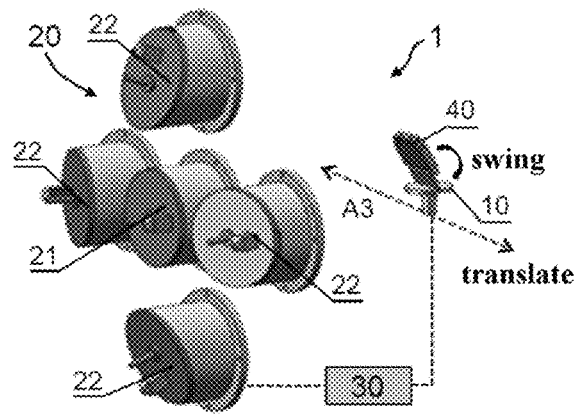
FIG. 5 schematically shows the structure of a manufacturing apparatus for microwave means according to a third embodiment.

FIG. 5 schematically shows the structure of a manufacturing apparatus for microwave means according to a third embodiment. This manufacturing apparatus has a same configuration as that of the second embodiment, differing only in the movement patterns of the fixture 10 and the insulating substrate 40.

In the operations of the manufacturing apparatus 1, the release ports of the sources 20 in the manufacturing apparatus 1 are first arranged in an angle with each other such that the release directions of metal ions intersect each other. When the insulating substrate 40 is moved to an appropriate station within the apparatus, all of the vertical source 21 and the tilted sources 22, or some of these sources, are switched on so that metal ions released from the sources 20 can be incident on the insulating substrate 40 in different directions. At the same time, in the effective coating areas, the fixture 10 loaded with the insulating substrate 40 is translated as a whole along a third axis A3 which intersects the moving direction of metal ions released from the source 20, preferably in a horizontal direction perpendicular to the moving direction. For example, the third axis A3 may be perpendicular to the moving direction of metal ions released from the vertical source 21, i.e., the first direction D1. The insulating substrate 40 may travel along the third axis A3 for a distance that is less than or equal to half of the length of the insulating substrate 40 in the direction of this third axis A3. Meanwhile the base 11 of the fixture 10 may also rotate about the first axis A1 shown in FIG. 2, or the carrier 12 of the fixture 10 may swing about the second axis A2 shown in FIG. 2, so as to increase the coverage of the metal ions on insulating substrate 40 and to improve the uniformity of the coating.

Figure 6:
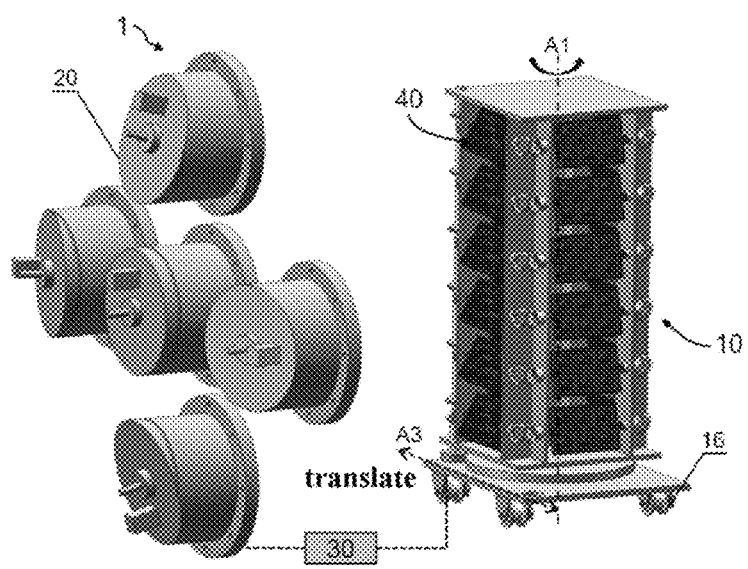
FIG. 6 schematically shows the structure of a manufacturing apparatus for microwave means according to an alternative of the third embodiment.

FIG. 6 schematically shows the structure of a manufacturing apparatus according to an alternative of the third embodiment. In this alternative, as shown in FIG. 3 a fixture 10 is employed, which is provided with a plurality of rollers 16 on the bottom surface of the base plate. These rollers 16 are embedded in a track provided along the third axis A3 and are capable of translating along the third axis A3 under the control of the controller 30. Thereby the fixture 10 is able to translate along the third axis A3 as a whole in operation, the base 11 of the fixture 10 is able to rotate about the first axis A1, and the carriers 12 loaded with the insulating substrates 40 are able to rotate about an axis intersecting the first axis A1.

Three embodiments of the manufacturing apparatus have been described above in order to achieve full metal coverage of the surface of microwave means and to avoid dead space, but the manufacturing apparatus of the present invention is not limited to these three embodiments. For example, the controller 30 can control the operation of the manufacturing apparatus 1 in one or a combination of the following ways: employing a plurality of sources 20 with different release directions; changing the angle of a same source 20 during operation; rotating the base 11 of the fixture 10 about the first axis A1; swinging the carrier 12 about a second axis A2; and translating the fixture 10 as a whole along a third axis A3. The third axis A3 along which the fixture 10 as a whole translates may also be not horizontal, but vertical or in some other direction intersecting the release direction of metal ions. Given the relativity of motion, it is also possible, for example, to keep the fixture 10 stationary while translating the source 20 in a certain direction intersecting the ion release direction.

In order to ensure full metallization of the surface of microwave means and good electrical conductivity of the metallized surface, special treatment may also be applied to the dead space for the metallization of the insulating substrate. These dead spaces for metallization are areas where it is difficult to coat with a metal layer by existing processes, i.e., areas with very thin or without metal coating, such as through holes, blind holes, sidewalls or corners of the microwave means. For example, the speed of movement of the individual components in the fixture, or the intensity or dose of metal ions released by the source at different moments, can be adjusted such that the dead spaces for metallization of the insulating substrate directly face the metal ions (i.e., perpendicular to the direction of movement of the metal ions). In one embodiment, the base of the fixture has a variable rotating speed as it rotates about the first axis, which speed is minimal when the dead spaces for metallization of the insulating substrate directly face the released metal ions. In one embodiment, the carrier of the fixture has a variable swinging speed as it swings about the second axis, the swinging speed being minimal when the dead spaces for metallization of the insulating substrate directly face the released metal ions. In one embodiment, the fixture has a variable translational speed as it translates along the third axis, the translational speed being minimal when the dead spaces for metallization of the insulating substrate directly face the released metal ions. In one embodiment, the metal ions released from the source have a variable intensity and/or dose, the intensity and/or dose being maximal when the dead spaces for metallization of the insulating substrate directly face the released metal ions.

Figure 7:
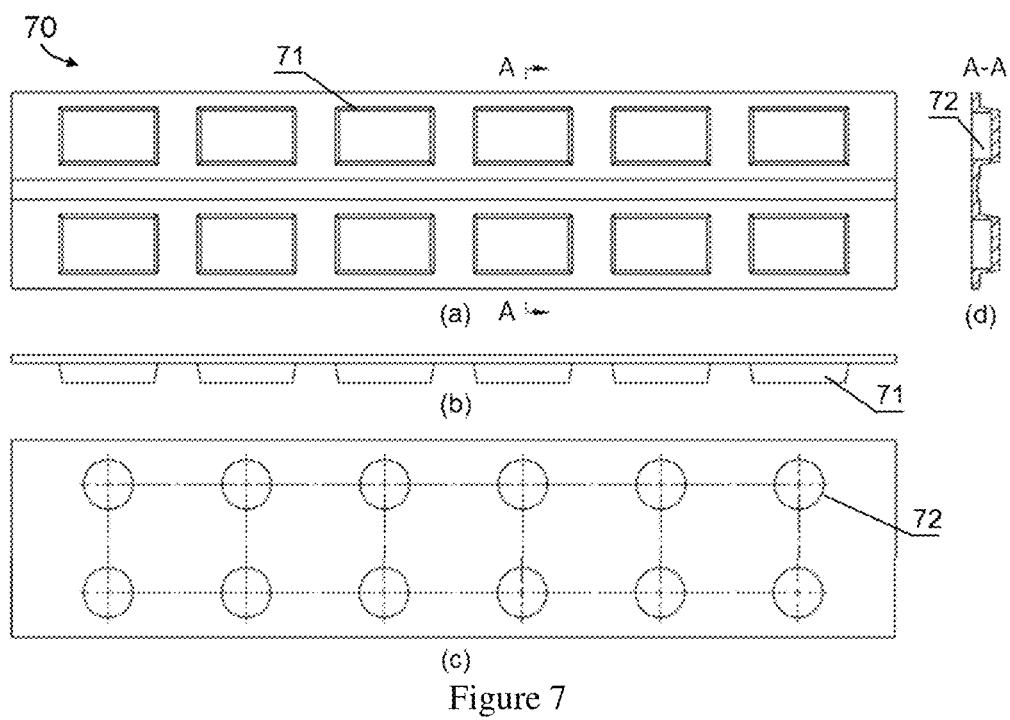

The above three embodiments are exemplified on the basis of the cavity filter 60 shown in FIG. 1. However, in addition to the cavity filter 60, the manufacturing apparatus 1 above may also be used to manufacture other kinds of microwave means, such as ceramic dielectric filters, cavity filters, antenna oscillators, or cell phone antennas. For example, the structure of an antenna oscillator 70 is illustrated in FIG. 7, wherein FIG. 7(*a*) shows a front view of the antenna oscillator, FIG. 7(*b*) shows a top view, FIG. 7(*c*) shows a rear view, and FIG. 7(*d*) a sectional view along the line A-A shown in FIG. 7(*a*). The antenna oscillator 70 as a whole is shaped as a rectangular flat plate and is provided with two rows of outwardly protruding radiation units 71 on the front side and inwardly recessed feeder networks 72 on the back side at positions corresponding to the radiation units 71. Using the above-described manufacturing apparatus 1, the insulating substrate of the antenna oscillator 70 is capable of receiving metal ions released from the source 20 from a number of different angles, and thus can be coated with a metal layer on both the outer side of the radiation units 71 and the inner concave side of the feeder networks 72.

The following describes a manufacturing method for microwave means according to the present invention. The manufacturing method primarily comprises the following steps: holding an insulating substrate of the microwave means on a carrier of a fixture in a manufacturing apparatus; switching on a source to release metal ions towards the insulating substrate; and controlling a movement pattern of the fixture and/or an angle of the source such that the insulating substrate receives the metal ions from a plurality of angles and a metal layer is formed over all surfaces of the insulating substrate. The manufacturing apparatus herein may be a manufacturing apparatus for microwave means described above, such as any of the manufacturing apparatuses 1 disclosed in the first to third embodiments.

The constituent materials of the insulating substrate may be selected according to the specific type and performance requirements of the microwave means. For example, during manufacturing the cavity filters, the insulating substrate may include polymeric materials such as PEI, PI, PPS, LCP, ABS and the like, which have a high glass transition temperature $T_g$ and a low coefficient of thermal expansion CTE. These polymeric materials may also be used with inorganic fillers such as glass fibers, ceramics and minerals to further reduce the CTE and improve thermal conductivity. during manufacturing the ceramic dielectric filters, tungsten bronze structured materials such as $BaO-Ln_2O_3-TiO_2$(BLT) series, modified $CaTiO_3$ series and modified lead-based perovskite series may be used for dielectric resonators in a low frequency range, Materials as $BaTi_4O_9$, $Ba_2Ti_9O_{20}$, $(Zr, Sn)TiO_4$, $CaTiO_3$, $SrTiO_3$, etc. may be employed for dielectric resonators in a medium frequency range, and composite perovskite structured material is employed for microwave means in a high frequency range. Further, other insulating materials, such as various resins, may also be used.

Before holding the insulating substrate, pre-treatment may be performed thereto. The pre-treatment may include degreasing, cleaning and drying of the insulating substrate to ensure that the surface of the insulating substrate is clean and dry. The pre-treatment may also include Hall ion source or anode layer ion source treatment for removing contaminants and impurities from the surface, while activating the insulating substrate surface to improve the bonding between the surface and the metal layer. In one embodiment, helium, argon, oxygen, nitrogen, ozone, hydrogen, and mixtures thereof may be used as the treatment gas for treating the insulating substrate for 30s-30 min at a voltage of 500V-2000V, a current of 0.03 A-2 A, and a temperature of 40° C.-150° C.

Ion injection may also be used as an alternative or complementary pre-treatment process. In the ion injection process, a metallic material is used as the target material, and is ionized by an electric arc under vacuum to produce ions, which are accelerated at a high voltage and gain high energy; the energetic metal ions impinge on the surface of the insulating substrate at a high velocity and are injected below the surface to a certain depth, forming a doping layer. Stable chemical bonds, such as ionic or covalent bonds, may be formed between the insulating material and the injected metal ions, thereby helping to improve the bonding between the metal layer formed on the surface of the insulating substrate and the insulating material, and to inhibit the peeling of the metal layer. Metals for ion injection include, but are not limited to, copper, iron, chromium, nickel, molybdenum, manganese, titanium, aluminum, and alloys of two or more of these elements. In addition, conductive oxides, conductive carbides, conductive organics or the like may be used as conductive materials for ion injection. Furthermore, various process parameters of the ion injection process, such as accelerating voltage, current, and processing time, can be determined based on the type of the insulating substrate material and the injected material, the desired bonding strength, and the thickness of the injection layer, etc. For example, in one embodiment, a doping layer with a thickness of 5 nm-50 nm is obtained using an ion injection energy of 5 keV-30 keV, an ion injection current of 1 mA-20 mA, and a processing time of 20 s-10 min.

When forming the metal layer, either a plasma deposition process or a magnetically controlled sputter deposition process may be used. Plasma deposition is performed in a similar way to ion injection, except that a lower accelerating voltage is applied during the operations. That is, a metallic material is also used as the target material, and the metallic material in the target material is ionized by an electric arc under vacuum to produce ions, which are accelerated under the action of an electric field and gain some energy, and are deposited onto the surface of the insulating substrate to form a plasma deposition layer. Metals for plasma deposition include, but are not limited to, copper, silver, iron, chromium, nickel, molybdenum, manganese, titanium, aluminum and alloys of two or more of these elements. In addition, the thickness of the plasma deposition layer and its bonding strength with the insulating substrate can be adjusted through such process parameters as the accelerating voltage of the electric field, the current and the processing time. In one embodiment, the deposition energy in the plasma deposition is 10 eV-100 eV, the deposition current is 50 A-70 A, the processing time is 30 s-10 min, and the generated temperature range is 40° C.-150° C., resulting in a plasma deposition layer with a thickness of 10 nm-200 nm.

Magnetically controlled sputter deposition involves filling a highly vacuum sputtering chamber with an inert gas and ionizing the inert gas under a high-frequency, high-voltage electric field to produce a glow discharge, resulting in a high-energy ion stream; bombarding the target electrode with this ion stream, and using a magnetic field to constrain the trajectory of the ion stream so that the material bombarded from the target electrode follows a certain path and is deposited on the surface of the insulating substrate to form a sputter deposition layer. The material of the target electrode includes, but is not limited to, copper, silver, nickel, gold, platinum and alloys of two or more of these elements. In one embodiment, the sputter deposition has a deposition current of 5 A-10 A, a deposition voltage of 300V-600V, a deposition energy of typically 10 eV or less, a deposition time of 5 min-10 min and a generated temperature range of 40° C.-150° C., resulting in a sputter deposition layer with a thickness of 1 μm-3 μm.

After the formation of the plasma deposition layer and/or sputter deposition layer, it is possible to further coat the deposition layer(s) with 5 μm-10 μm of a metal material such as copper or chromium by electroplating or chemical plating to form a thickening layer, the deposition layer(s) and the thickening layer constituting the metal layer of the present invention. During the electroplating process, the thickness of the thickening layer can be adjusted conveniently and easily by selecting among processes such as cyanide copper plating, sulfate copper plating, pyrophosphate copper plating, and cyanide-free copper plating, and by adjusting various parameters such as the current and operating time during electroplating.

After the metal layer is formed, the surface of the insulating substrate having undergone vacuum treatment and injection/deposition treatment can also be plated with nickel, tin, gold, silver or the like by electroplating or chemical plating to form a welding(soldering) protection layer.

FOURTH EMBODIMENT

Reference is now made to FIG. 8 to illustrate a manufacturing method for microwave means according to a fourth embodiment of the present invention, wherein FIGS. 8(a) to 8(d) schematically show changes in the section view of an insulating substrate of a microwave means corresponding to various steps of the method.

First, using helium as the treatment gas for the Hall ion source, the insulating substrate 40 shown in FIG. 8(a) is pretreated at a voltage of 1000 V, a current of 1 A, and a temperature of 100° C. for a processing time of 10 min.

The plurality of treated insulating substrates 40 are then held on the carriers 12 of the fixture 10 in the manufacturing apparatus as shown in FIG. 3, and a first plasma deposition source is used as the source 20 for releasing metal ions towards the insulating substrate 40. The target material of the first plasma deposition source is nickel. During the plasma deposition process, a first deposition layer 511 with a thickness of 20 nm is formed on all surfaces 41 of the insulating substrates 40 using a deposition energy of 50 eV, a deposition current of 50 A, and a treatment temperature of 120° C. for 4 min. As shown in FIG. 8(b), the first deposition layer 511 is attached to the top of the surface 41 of the insulating substrates 40.

The first plasma deposition source is then replaced with a second plasma deposition source, which acts as a new source to continue releasing metal ions towards the insulating substrates. The target material of the second plasma deposition source is a metal material with excellent electrical conductivity and heat dissipation, which, for example, can be copper, silver or an alloy thereof. Copper and silver each has a electric resistivity of $1.68 \times 10^{-8}$ Ω·m and $1.59 \times 10^{-8}$ Ω·m, and thermal conductivity of 401 W/m K and 429 W/m K, respectively. During the plasma deposition process, a second deposition layer 512 with a thickness of 30 nm is formed on all surfaces 41 of the insulating substrates 40 using a deposition energy of 80 eV, a deposition current of 60 A, and a treatment temperature of 120° C. for 6 min. As shown in FIG. 8(c), the second deposition layer 512 is attached to the top of the surface of the first deposition layer 511, the first deposition layer 511 and the second deposition layer 512 constituting a plasma deposition layer 51.

Next, the insulating substrates 40 formed with the plasma deposition layer 51 are placed into an electroplating bath, and a thickening layer 54 including copper and having a thickness of 8 μm is formed on the surface of the insulating substrates 40 via conventional copper plating. As shown in FIG. 8(d), the thickening layer 54 is attached over the surface of the second deposition layer 512, the plasma deposition layer 51 and the thickening layer 54 constituting a metal layer 50. In this way, a microwave means 4 with a metal layer 50 covering all the surfaces 41 is finally produced.

Finally, tin plating is applied to specific areas of the insulating substrates 40 by means of electroplating to form a welding protection layer.

FIFTH EMBODIMENT

Reference is now made to FIG. 9 to illustrate a manufacturing method for microwave means according to a fifth embodiment of the present invention, wherein FIGS. 9(a) to 9(d) schematically show changes in the section view of an insulating substrate of a microwave means corresponding to the various steps of the method.

First, the insulating substrate 40 as shown in FIG. 9(a) is degreased, cleaned and dried. During the drying process, the insulating substrate 40 is placed in a heating oven and heated for 20 min within a temperature range of 100° C.-150° C. to fully discharge the air and moisture from its interior for subsequent treatment with various ion sources.

The treated insulating substrate 40 is then held on the carrier of the fixture in the manufacturing apparatus and an ion injection source is used as the source for releasing metal ions towards the insulating substrate. The target material of the ion injection source is titanium. An ion injection energy of 10 keV, an ion injection current of 5 mA and a processing time of 5 min are used in the ion injection process. As shown in FIG. 9(b), titanium ions are injected below the surface 41 of the insulating substrate 40 to form a doping layer 52 of a thickness of 20 nm together with the constituent material of the insulating substrate 40. The metal titanium has good bonding with the polymer substrate, and an injection to a depth of 20-50 nm is sufficient as a priming layer. In addition, a titanium-copper alloy or titanium-aluminum alloy can also be chosen as a priming layer with a thickness of 50-100 nm. Titanium and copper or aluminum with excellent electrical conductivity can ensure the bonding without reducing the electrical conductivity.

Thereafter, a plasma deposition source is used to replace the ion injection source as a new source, which continues to release metal ions towards the insulating substrate. The target material of the plasma deposition source is titanium. During this deposition process, a plasma deposition layer 51 with a thickness of 25 nm is formed on all surfaces 41 of the insulating substrate 40 using a deposition energy of 80 eV, a deposition current of 60 A, and a processing temperature of 140° C. for 5 min. As shown in FIG. 9(c), the plasma deposition layer 51 is attached to the top of the surface 41 of the insulating substrate 40 and is tightly connected to the doping layer 52.

Next, a magnetically controlled sputter deposition source is used to replace the plasma deposition source as a new source, which continues to release metal ions towards the insulating substrate. The target material of the magnetically controlled sputter deposition source is copper. During the magnetically controlled sputtering process, a sputter deposition layer 53 with a thickness of 1 μm is formed on top of the plasma deposition layer 51, using a deposition current of 6 A, a deposition voltage of 400 V, a deposition energy of 8 eV, and a processing temperature of 140° C. for 8 min. As shown in FIG. 9(d), the sputter deposition layer 53 is attached to the top of the plasma deposition layer 51. By magnetically controlled sputter deposition, the thickness of the metal layer can be further increased and the sheet resistance can be reduced to below 50 mΩ to facilitate the subsequent plating process.

Next, the insulating substrate 40 formed with the doping layer 52, the plasma deposition layer 51 and the sputter deposition layer 53 is placed in an electroplating bath, and a thickening layer 54 consisting of copper with a thickness of 10 μm is formed on its surface by means of copper electroplating. As shown in FIG. 9(e), the thickening layer 54 is attached to the top of the sputter deposition layer 53, and the plasma deposition layer 51, the sputter deposition layer 53 and the thickening layer 54 constitute a metal layer 50. In this way, a microwave means 4 having all surfaces 41 covered with a metal layer 50 is finally formed.

Finally, tin plating is applied to specific areas of the insulating substrate by chemical plating to form a welding protection layer.

In the microwave means 4 shown in FIG. 9(e), metal ions are injected below the surface of the insulating substrate 40 to form a doping layer 52, rather than above the surface, which is equivalent to a large number of "foundation piles" being buried under the surface of the insulating substrate 40. The plasma deposition layer 51 is tightly connected to the doping layer 52, the sputter deposition layer 53 is attached on top of the plasma deposition layer 51, and the thickening layer 54 is in turn attached on top of the sputter deposition layer 53. Thus, the metal layer 50 comprising the plasma deposition layer 51, the sputtering deposition layer 53 and the thickening layer 54 has a greater bonding strength to the insulating substrate 40. Furthermore, the metal materials in both the doping layer 52 and the plasma deposition layer 51 have extremely small dimensions in a Nano-scale, resulting in a more uniform density of the injected and deposited metal particles and a substantially uniform direction of incidence. Therefore, pinholes are less likely to appear on the surface of the metal layer 50 and the interface between the metal layer 50 and the insulating substrate 40 is also uniformly flat with a low surface roughness.

Compared to filters in the prior art, the filter prepared by the method above has a surface roughness Ra of about 0.6 μm, which is much lower than 1 μm-3 μm in the case of prior art chemical treatment. Existing chemical treatment attacks and etches the substrate surface with a chemical solution to create a rough morphology and increase the specific surface area, thereby improving the bonding; after chemical raking or nickel plating followed by copper plating on the roughened surface, the resulting surface remains rough, resulting in high losses during signal transmission. In contrast, the ion injection or plasma treatment of the present invention does not increase the surface roughness and thus does not increase the loss during signal transmission, which is therefore beneficial for signal transmission. For example, the filter of the present invention is capable of achieving an insertion loss of −1.0 dB or less, which is a reduction of approximately 20% compared to the prior art, and is also capable of achieving out-of-band inhibition of −60 dB or more, but with a temperature drift that remains substantially comparable to the existing filters.

Two embodiments of the manufacturing method are described above for forming a metal layer on all surfaces of the microwave means, wherein an ion injection source, a plasma deposition source and a magnetically controlled sputter deposition source may all be used as a source for each of the above manufacturing apparatuses, i.e., capable of releasing metal ions from different directions relative to the insulating substrate. However, the manufacturing method of the present invention is not limited to these two embodiments. For example, only a magnetically controlled sputter deposition source may be used to form the metal layer; an ion injection source may be used to first form a doping layer below the surface of the insulating substrate, and then a magnetically controlled sputter deposition source may be directly used to form a sputter deposition layer above the doping layer; or a magnetically controlled sputter deposition layer may be formed first on the surface of the insulating substrate and then a plasma deposition source may be used to form a plasma deposition layer above the sputter deposition layer. By means of ion injection and plasma deposition technology, the present invention is able to obtain a metal layer with a high bonding strength and a low surface roughness on the surface of microwave means, endowing the microwave means with better electrical properties and greater stability.

The present invention is not limited to the particular embodiments described above. It is readily understood that, without departing from the spirit of the present invention, the person skilled in the art may make various obvious modifications, adaptations and substitutions to these embodiments in order to make them suitable for particular circumstances. Indeed, the scope of the present invention is defined by the claims but may include other examples that can be envisaged by those skilled in the art.

What is claimed is:

1. A manufacturing apparatus for microwave means, comprising:
   a fixture, the fixture comprising a base capable of rotating about a first axis, and a carrier capable of swinging about a second axis, the carrier being connected to the base so as to hold an insulating substrate, wherein the first axis intersects the second axis;
   a source for releasing metal ions towards the insulating substrate;
   a controller, the controller coupled to the fixture and the source and configured to control a movement pattern of the fixture and/or an angle of the source such that the insulating substrate receives the metal ions from a plurality of angles and a metal layer is formed over all surfaces of the insulating substrate, wherein the controller is configured so that, the base of the fixture has a variable rotating speed when rotating about the first axis, which rotating speed is minimal when a dead space for metallization of the insulating substrate directly faces the released metal ions; or wherein the controller is configured so that, the carrier of the fixture has a variable swinging speed when swinging about the second axis, which swinging speed is minimal when the dead space for metallization of the insulating substrate directly faces the released metal ions.

2. The manufacturing apparatus according to claim 1, wherein the fixture comprises a plurality of carriers arranged along the first axis, the plurality of carriers comprising a first carrier capable of swinging about a fourth axis and a second carrier capable of swinging about a fifth axis, the fourth axis intersecting the fifth axis and both being perpendicular to the first axis.

3. The manufacturing apparatus according to claim 1, wherein the source comprises a vertical source, the vertical source releasing metal ions in a first direction substantially perpendicular to a bottom surface of the insulating substrate.

4. The manufacturing apparatus according to claim 3, wherein the source comprises a tilted source, the tilted source releasing metal ions in a second direction intersecting the first direction.

5. The manufacturing apparatus according to claim 4, wherein a plurality of tilted sources are provided around one vertical source, and wherein the first direction is at an angle of 15-60° relative to the second direction.

6. The manufacturing apparatus according to claim 1, wherein the first axis is vertically oriented, and wherein the second axis is located on an upper surface of the base and intersects the first axis.

7. The manufacturing apparatus according to claim 1, wherein the fixture is capable of translating as a whole along a third axis, the third axis intersecting a moving direction of the metal ions released from the source.

8. The manufacturing apparatus according to claim 1, wherein the source is replaceable and comprises a plasma deposition source, and wherein metal ions released from the plasma deposition source are deposited onto the surface of the insulating substrate to form a plasma deposition layer as at least a portion of the metal layer.

9. The manufacturing apparatus according to claim 8, wherein the source further comprises one or more of: an ion injection source, metal ions released therefrom being injected below the surface of the insulating substrate to form a doping layer; a magnetically controlled sputter deposition source, metal ions released therefrom being deposited onto the surface of the insulating substrate to form a sputter deposition layer.

10. The manufacturing apparatus according to claim 5, wherein the first direction is at an angle of 45° relative to the second direction.

11. A manufacturing method for microwave means, comprising:
holding an insulating substrate on a carrier of a fixture, the fixture comprising a base capable of rotating about a first axis and the carrier connected to the base and capable of swinging about a second axis, wherein the first axis intersects the second axis;
switching on a source to release metal ions towards the insulating substrate; and
controlling a movement pattern of the fixture and/or an angle of the source such that the insulating substrate receives the metal ions from a plurality of angles and a metal layer is formed over all surfaces of the insulating substrate, wherein the base of the fixture has a variable rotating speed when rotating about the first axis, which rotating speed is minimal when a dead space for metallization of the insulating substrate directly faces the released metal ions; or wherein the carrier of the fixture has a variable swinging speed when swinging about the second axis, which swinging speed is minimal when the dead space for metallization of the insulating substrate directly faces the released metal ions.

12. The manufacturing method according to claim 11, wherein the source comprises a plurality of sources, and wherein the manufacturing method comprises adjusting angles of the plurality of sources so that metal ions are released from a vertical source of the plurality of sources in a first direction substantially perpendicular to a bottom surface of the insulating substrate, and released from a tilted source of the plurality of sources in a second direction intersecting the first direction.

13. The manufacturing method according to claim 12, wherein a plurality of tilted sources are provided around one vertical source, and wherein the first direction is at an angle of 15-60° relative to the second direction.

14. The manufacturing method according to claim 11, wherein the first axis is vertically oriented, the second axis being located on an upper surface of the base and intersecting the first axis.

15. The manufacturing method according to claim 11, wherein controlling a movement pattern of the fixture comprises one or more of:
rotating the base of the fixture about the first axis;
swinging the carrier of the fixture about the second axis; and
translating the fixture as a whole along a third axis, the third axis intersecting a moving direction of the metal ions released from the source.

16. The manufacturing method according to claim 15, wherein
the fixture has a variable translational speed when translating along the third axis, which translational speed is minimal when the dead space for metallization of the insulating substrate directly faces the released metal ions.

17. The manufacturing method according to claim 11, wherein the metal ions released from the source have a variable intensity and/or dose, the intensity and/or dose being maximal when the dead space for metallization of the insulating substrate directly faces the released metal ions.

18. The manufacturing method according to claim 16, wherein the dead space for metallization comprises through holes, blind holes, sidewalls or corners of the microwave means.

19. The manufacturing method according to claim 11, wherein the source is replaceable and comprises a plasma deposition source, and wherein the manufacturing method comprises depositing metal ions released from the plasma deposition source onto the surface of the insulating substrate to form a plasma deposition layer as at least a portion of the metal layer.

20. The manufacturing method according to claim 19, wherein the manufacturing method comprises: depositing one or more of copper, iron, chromium, nickel, molybdenum, manganese, titanium, aluminum and alloys thereof onto all the surfaces of the insulating substrate to form a first deposition layer; and, depositing copper, silver or an alloy thereof onto all the surfaces of the insulating substrate to form a second deposition layer, the first deposition layer and the second deposition layer forming the plasma deposition layer.

21. The manufacturing method according to claim 19, wherein the manufacturing method further comprises one or more of:

pre-treating the insulating substrate using a Hall ion source or an anode layer ion source prior to holding the insulating substrate;

using the ion injection source as the source, injecting metal ions released from the ion injection source below the surface of the insulating substrate to form a doping layer, prior to forming the plasma deposition layer;

using a magnetically controlled sputter deposition source as the source, depositing metal ions released from the magnetically controlled sputter deposition source onto the surface of the insulating substrate to form a sputter deposition layer as part of the metal layer; and plating copper or chromium on the plasma deposition layer or the sputter deposition layer by means of electroplating or chemical plating, to form a thickening layer as part of the metal layer.

22. The manufacturing method according to claim 11, wherein the microwave means comprises a ceramic dielectric filter, a cavity filter, an antenna oscillator or a cell phone antenna.

23. The manufacturing method according to claim 13, wherein the first direction is at an angle of 45° relative to the second direction.

* * * * *